(12) United States Patent
Sunier et al.

(10) Patent No.: US 7,696,749 B2
(45) Date of Patent: Apr. 13, 2010

(54) RESONATOR-BASED MAGNETIC FIELD SENSOR

(75) Inventors: Robert Sunier, Zurich (CH); Oliver Brand, Atlanta, GA (US); Tobias A. Vancura, Zurich (CH)

(73) Assignee: Sensirion Holding AG, Stafa (CH)

( * ) Notice: Subject to any disclaimer, the term of this patent is extended or adjusted under 35 U.S.C. 154(b) by 291 days.

(21) Appl. No.: 11/574,025

(22) PCT Filed: Aug. 22, 2005

(86) PCT No.: PCT/IB2005/002467

§ 371 (c)(1),
(2), (4) Date: May 11, 2007

(87) PCT Pub. No.: WO2006/021858

PCT Pub. Date: Mar. 2, 2006

(65) Prior Publication Data

US 2009/0015250 A1    Jan. 15, 2009

(51) Int. Cl.
*G01R 33/02*    (2006.01)
(52) U.S. Cl. ..................................... 324/244
(58) Field of Classification Search ................. 324/244
See application file for complete search history.

(56) References Cited

U.S. PATENT DOCUMENTS 6,429,652 B1    8/2002    Allen et al.

OTHER PUBLICATIONS

Robert Sunier et al.; "Resonant Magnetic Field Sensor with Frequency Output"; 18th IEEE International Conference on Micro Electro Mechanical Systems (IEEE Cat. No. 05CH37610) IEEE Piscataway, NJ, USA; Jan. 30, 2005; pp. 339-342; XP002373692.

Bahreyni B. et al.; "Analytic Modeling and FEM Simulation of a Resonant Micromachined Magnetic Field Sensor"; Electrical and Computer Engineering; 2004; pp. 189-192 vol. 1; XP010733419.

International Search Report for corresponding Application No. PCT/IB2005/002467 mailed Apr. 11, 2006.

*Primary Examiner*—Reena Aurora
(74) *Attorney, Agent, or Firm*—Renner, Otto, Boisselle & Sklar, LLP (57) ABSTRACT

The resonator-based magnetic field sensor system has an oscillatory member as resonator, means for driving an electrical current through said resonator such that its resonance frequency is altered by an external magnetic field to be measured (measurand), and means for detecting or measuring said altered resonance frequency. A secondary excitation of the resonator is effected to determine the said altered resonance frequency from which the measurand can be deduced. In the preferred embodiment, the secondary excitation is included in a closed loop, thus creating an oscillator vibrating at the altered resonance frequency. Though it is known to use the oscillation amplitude of a suitable resonator for this purpose, the novel sensor system identifies and/or measures the frequency (not the amplitude) of the oscillation, which is a function of the magnetic field to be measured.

15 Claims, 8 Drawing Sheets

RESONATOR-BASED MAGNETIC FIELD SENSOR

FIELD OF THE INVENTION

This invention relates to magnetic field sensing and in particular, to a system and a technique which exploit a mobile mechanical structure to provide a magnetic field sensor (magnetometer) offering a frequency as output.

BACKGROUND OF THE INVENTION

Resonator-based magnetic field sensors can principally be divided in two categories, depending on the origin of the magnetic force used to generate or modify the movement of the resonator. In a first case, a current flowing through the resonator creates a Lorentz force in the presence of the magnetic field to be measured (termed measurand in the following). In a second case, the measurand passively generates a torque on a magnetic material fixed to or deposited on the resonator.

In the frame of magnetic field sensors fabricated with microelectromechanical system (MEMS) technologies, numerous resonating-structure types can be exploited in many different oscillation modes. Beams [V. Beroulle, Y. Bértrand, L. Latorre, P. Nouet, "Monolithic piezoresistve CMOS magnetic field sensors", Sensors and Actuators A, 103, 23-42, 2003], torsional plates [Z. Kadar, A. Bossche, P. M. Sarro, J. R. Mollinger, "Magnetic-field measurements using an integrated resonant magnetic-field sensor", Sensors and Actuators A, 70, pp 225-232, 1998], and suspended mass [H. Emmerich and M. Schöfthalter, "Magnetic field measurements with a novel surface micromachined magnetic-field sensor" IEEE Transactions on Electron Devices, 47, no. 5, pp. 972-977, 2000], [T. C. Leichlé, M. von Arx, S, Teiman, I. Zana, W. Ye, M. G. Allen, "A low-power resonant micromachined compass", Journal of Micromechanics and Microengineering, 14, pp. 462-470, 2004] have been reported.

Devices based on the Lorentz force usually provide an amplitude output. Several implementations are possible. The simplest one consists in operating the resonator in an open-loop excitation as presented in FIG. 1. In this case, an oscillator preferably tuned at the resonance frequency of the mechanical structure is used to deliver an alternating excitation current on the resonator. Together with the measurand, this current creates a Lorentz force which brings the resonator in oscillation. The amplitude of oscillation, which is typically proportional to the measurand, constitutes the output of the sensor; see V. Beroulle above. The performances of these devices may be improved thanks to the additional implementation of zero-force feed-back loops as proposed by Z. Kadar, see above. The drawback of open-loop-excitation approaches is that the matching of the excitation-oscillator tuning with the resonance frequency of the moving structure may degrade with aging or environmental condition changes, leading to important variation of sensitivity. To prevent this, closed-loop excitations providing automatic resonance-frequency tracking instead of an external oscillator can be used (see FIG. 2). The idea is to actuate the resonator with a measurand-dependent Lorentz force in phase with its velocity, in order to diminish or compensate its damping. This kind of device requires their oscillation amplitude to be stabilized. This can be achieved with an automatic gain controller (the setting of which is the output) or using constant amplitude output for the electronics. In this later case, the output is the movement amplitude of the resonator. Such concepts have been exploited, for example, by Emmerich, see above.

Recently, a system proposing an additional measurand-independent closed-loop excitation, which lets the system oscillate even in the absence of magnetic field has been described in WO 2005 029 107. In this case, the measurand only modifies the oscillation amplitude. Such architecture enables to calibrate the offset of the sensor, and is said to provide a better resolution.

Resonator-based magnetic field sensors exploiting magnetic materials have for example been described in U.S. Pat. No. 6,429,652 B1. In this application, the resonator is actuated by a frequency-tunable, open-loop, measurand-independent excitation. The alternating torque generated by the interaction of the moving magnetic material and the measurand acts as an additional spring constant on the resonator. Since the resonance frequency of the resonator is a function of the spring constant, it is affected by the magnetic field. In this patent, the resonance frequency is determined by scanning the excitation frequencies and searching for the point where the oscillation is maximal.

Sensors using the Lorentz force have the advantage not to require magnetic materials, which simplify their fabrication. Moreover, they do not suffer from unwanted hysteresis or magnetic saturation effects and therefore offer considerable input ranges. Finally, thanks to the active nature of the principle, these sensors can be made independent of the measurand by switching off the excitation current. This feature can be useful for calibration purposes. On the other hand, sensors using magnetic materials enable low-power systems (passive measurand excitation), and frequency outputs, even though such a frequency output has not been presented in U.S. Pat. No. 6,429,652, cited above.

Similarily to digital signals, frequency/time signals (frequency, period, duty-cycle, phase shift, etc.) offer a significantly higher noise immunity than amplitude signals (voltage or current), and are therefore well suited for electrically noisy environments or for long transmission lines. Moreover, frequency outputs can easily achieve wide dynamic ranges which are not limited between the noise level and the supply voltage, as it is the case of amplitude outputs. Furthermore, the signal multiplexing and conditioning circuitry for frequency output devices is usually less challenging as this modulation is less sensitive to the quality of the electronics, e.g. the linearity does not directly affect the frequency, and less vulnerable to noise or crosstalk. Finally, the analog-to-digital conversion of frequency signals can be performed by simple pulse counting, and thus can be executed by microcontrollers without any additional interface circuitry, i.e. without A/D converters and the like. Conversion accuracies generally higher than for amplitude signals can be achieved, thanks to the better precision of frequency than of voltage references.

SUMMARY OF THE INVENTION

The present invention provides a resonator-based magnetic field sensor, which exploits the Lorentz force and its advantages, e.g. calibration possibility, no magnetic material, but in contrast to similar known implementations, delivers a frequency output. As mentioned in the preceding section, frequency-output sensors have valuable advantages over amplitude-output sensors.

The basic concept of the invention consists in using the Lorentz force to modify the resonance frequency of the resonator. The principle can be explained considering a simple 1-dimensional spring-mass system with spring constant k and mass m as model for the resonator. The motion equation and the resonance frequency $f_0$ of such a system are given by:

$$m\ddot{x} = -kx$$

$$f_0 = \frac{1}{2\pi}\sqrt{\frac{k}{m}}.$$

If an excitation current 1 proportional to the position or acceleration is sent through the mass over a length L perpendicularly to the measurand, the following Lorentz force is exerted:

$$F_L = BLI = BLk_{Bx}x, \text{ or } F_L = BLI = BLk_{Bm}\ddot{x}.$$

The system motion equation, and its resonance frequency then becomes:

$$m\ddot{x} = -kx + BLk_{Bx}x$$

$$f_0 = \frac{1}{2\pi}\sqrt{\frac{k - BLk_{Bx}}{m}}, \text{ or}$$

$$m\ddot{x} = -kx + BLk_{Bx}\ddot{x}$$

$$f_0 = \frac{1}{2\pi}\sqrt{\frac{k}{m - BLk_{Bm}}}.$$

The resonance frequency is then a function of the measurand. Depending of the sign of the proportionality constants $k_{Bx}$, or $k_{Bm}$, the Lorentz force is in phase or in opposite phase with the position or the acceleration and acts as an artificial change of spring constant or mass.

Note that systems where the current would not be strictly proportional to the position or the acceleration, but would only be in phase (or in opposite phase) with them may also work and should be considered as belonging to this invention as well, e.g. square-wave instead of sine-wave excitation. In the following, when "in phase" is used, it generally means in phase or in opposite phase.

Setting a current in phase with the position or the acceleration of the mechanical structure can be realized by means of a closed-loop architecture as it is done for the velocity (see above). The schematic of FIG. 2 then also represents a possible implementation of this idea, with the difference that the current is then in phase with the position or acceleration, instead of the velocity. According to the calculation above, the set comprising the resonator and its Lorentz force based feedback loop behaves itself like a resonator, the resonance frequency of which is measurand-dependent. It will be termed measurand-altered resonator in the following. Any means able to measure the resonance frequency of mechanical resonators can then be used to make a magnetic field sensor out of the measurand-altered resonator (FIG. 3).

Generally, in order to measure their resonance frequencies, mechanical structures are brought into movement. To this end, an excitation, called secondary excitation in the following, is required. It may be used in open or closed loop as presented below. In the case of the measurand-altered resonator, the actuator performing the secondary excitation preferably does not involve magnetic fields, in order not to perturb the measurand or to be influenced by the measurand. Several solutions described below are possible.

The sensor may for example be excited by a secondary excitation of variable frequency. By scanning the excitation frequencies around resonance, the frequency corresponding to the measurand-altered resonator maximal output amplitude or phase drop, i.e. the desired resonance frequency, can be extracted, as proposed in U.S. Pat. No. 6,429,652 B1. In this document, a method to find the resonance frequency of a magnetic material based device by searching for the maximum magnitude of the transfer function is described. This approach is however time consuming and requires relatively complicated signal processing usually not well suited to smart micro sensors. Moreover, it does not take advantage of the frequency output opportunity offered by the proposed sensing principle.

If the Q-factor of the resonator is high enough, the resonance frequency can be obtained from the response of the measurand-altered resonator to a single pulse or step secondary excitation.

The method exploited in the preferred embodiment consists in using the measurand-altered resonator as the frequency-determining element of an electrical oscillator. In this architecture, the secondary excitation works in closed-loop (feed-back) and is used to start, sustain and stabilize the resonator oscillation. When the sensor is correctly tuned, it oscillates at the resonance frequency of the measurand-altered resonator and automatically tracks it. This results in the architecture illustrated in FIG. 3. Another advantage of this implementation is that the current generating the Lorentz force can be switched off while the secondary excitation loop is still active. This way, the resonance frequency of the resonator, which may change as a function of the environmental conditions or the aging of the device, can easily be measured without the measurand influence, even in the presence of the measurand. A continuous offset cancellation can thus be performed.

DETAILED DESCRIPTION OF A PREFERRED EMBODIMENT

The following is a detailed description of a preferred embodiment in connection with a number of drawings in which.

Figure 1:
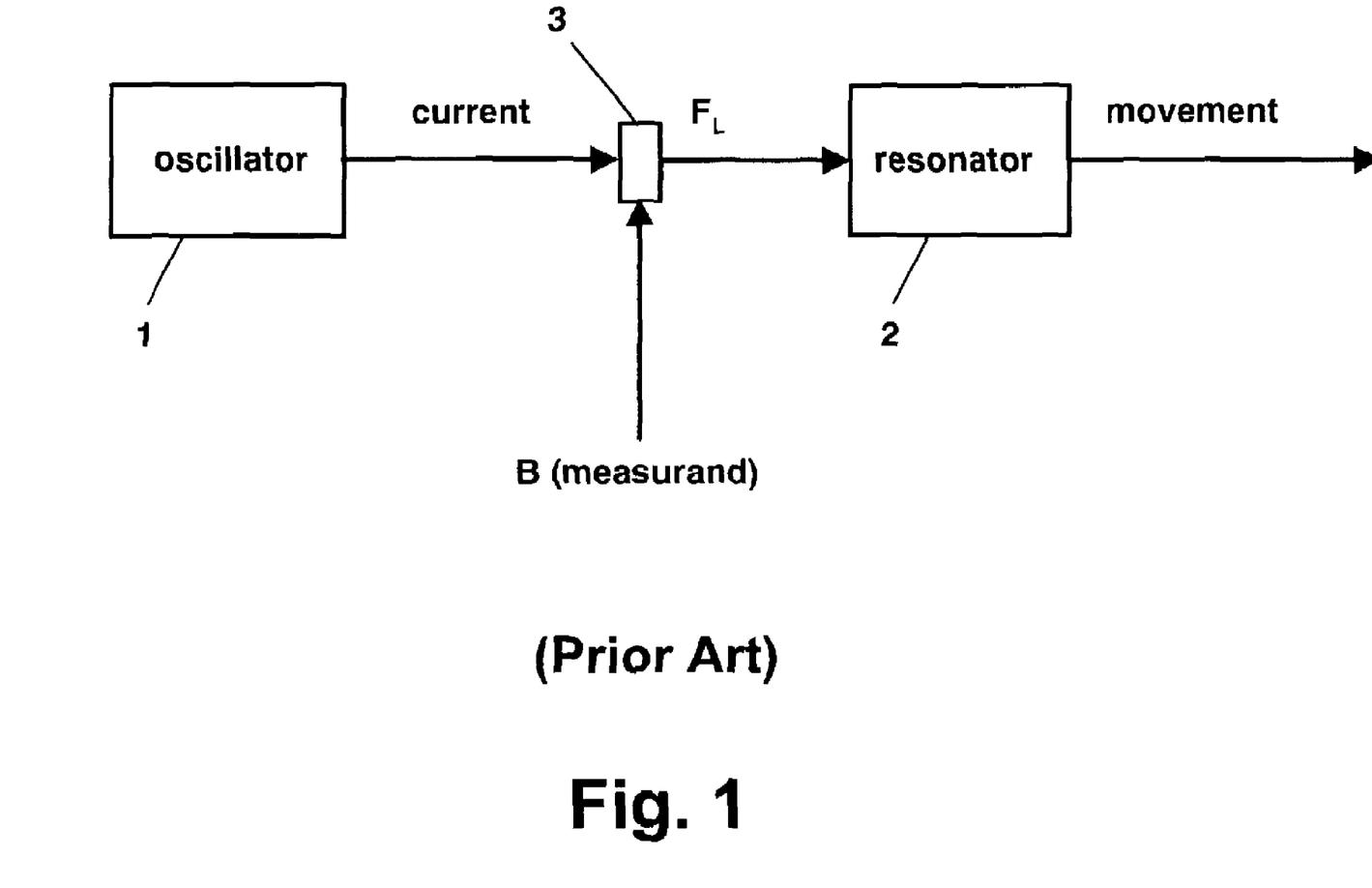
FIG. 1 shows a prior art open-loop architecture for a resonator-based magnetic field sensor.

As already addressed above, FIG. 1 shows a basic layout with an oscillator 1 and a resonator 2. The oscillator 1 provides an AC current, preferably at the resonance frequency of the resonator 2. An alternating Lorentz force $F_L$ results from the interaction, indicated by the box 3, between the current and the measurand. This force acts on the resonator which consequently starts to oscillate with an amplitude usually proportional to the measurand.

Figure 2:
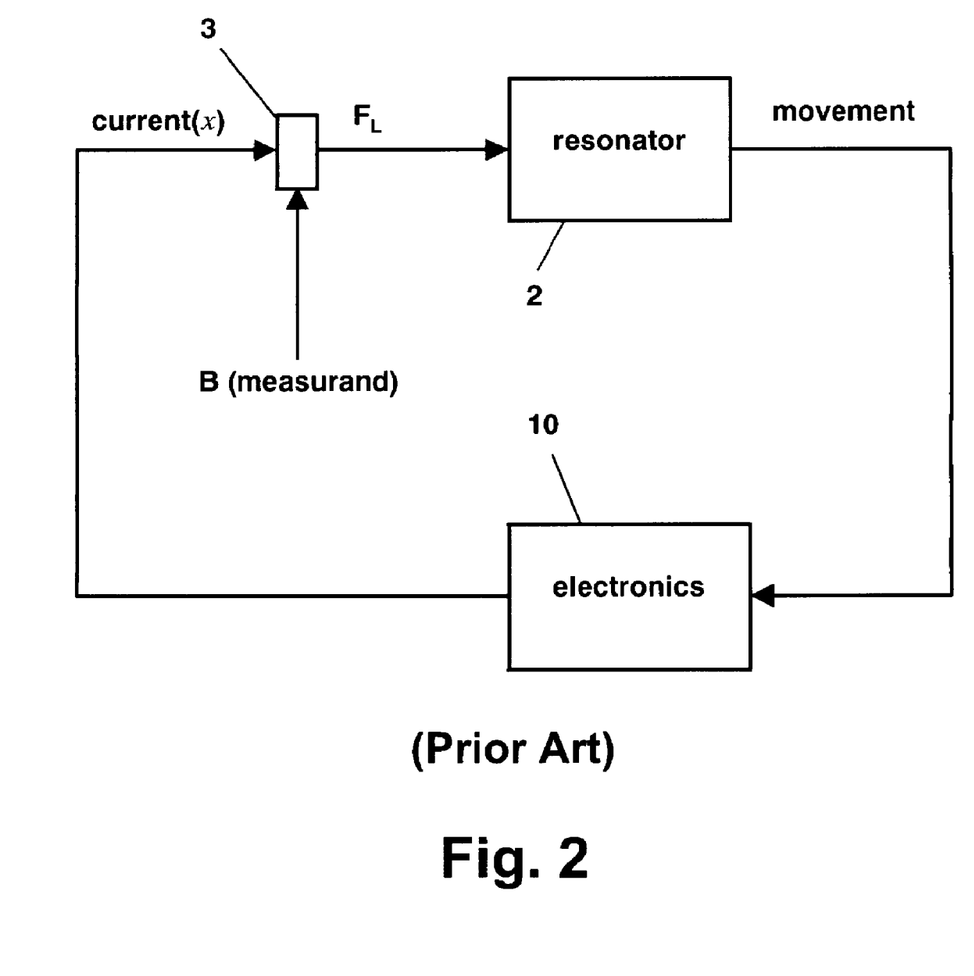
FIG. 2 depicts a prior art closed-loop architecture for a resonator-based magnetic field sensor.
Figure 3:
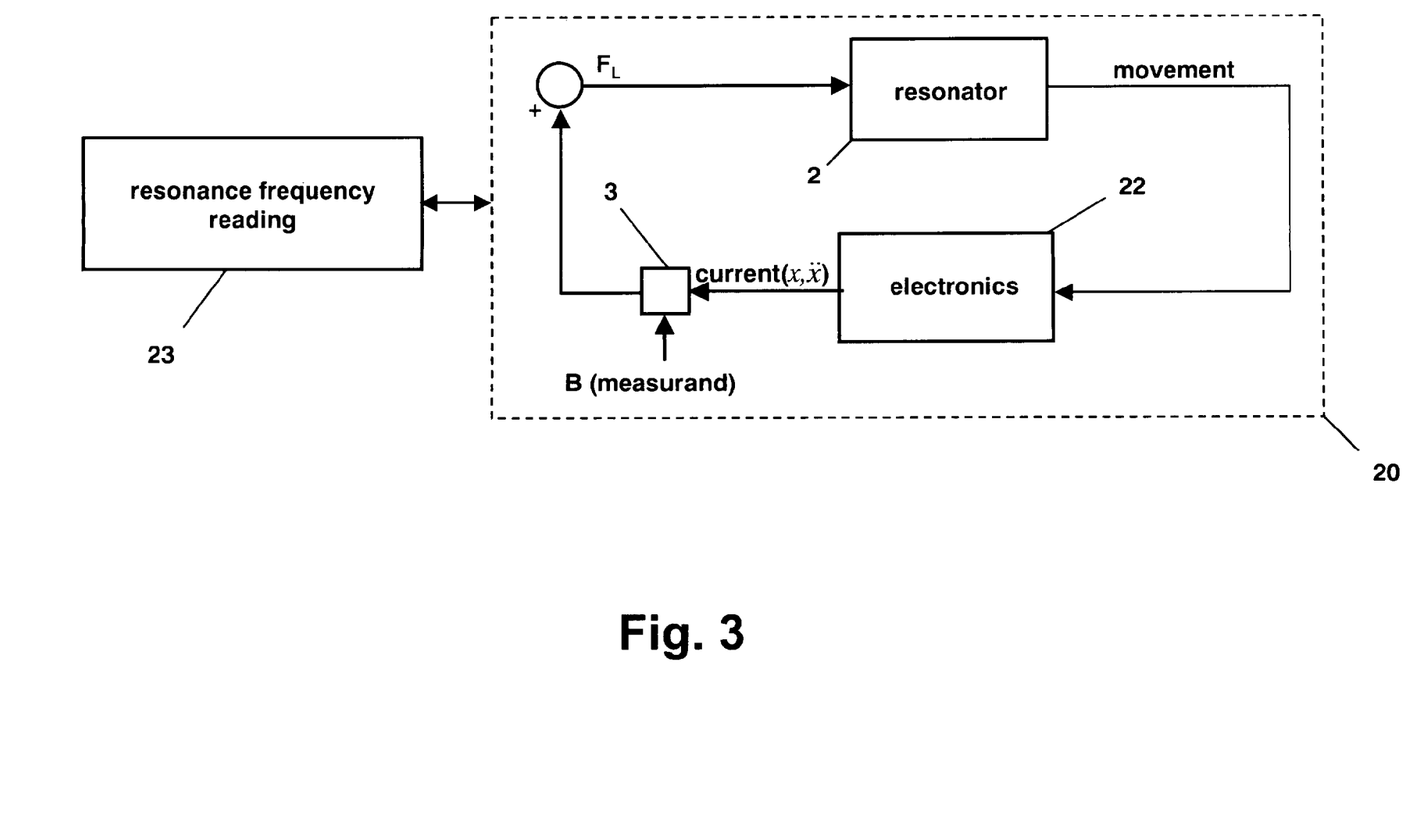
FIG. 3 represents the basic idea of the present invention.

FIG. 2 illustrates a closed-loop architecture which does not require an external oscillator. The electronic circuitry 10 is designed such that it produces a current in phase with the velocity of the resonator 2, hence creating a positive feedback force, namely a Lorentz force, in the presence of a the measurand B.

FIG. 3 shows the basic principle of the invention. The core of the sensor consists of a Lorentz force based closed-loop system 20, which includes the resonator 2 and some electronic circuitry 22. The electronics produces a current in phase with the position or the acceleration of the resonator. This results in that the Lorentz force based closed-loop system 20 is equivalent to a new resonator, the resonance frequency of which is modulated by the measurand B. In accordance with the preceding section, it is called measurand-altered resonator in the following. In order to create a magnetic field sensor from the measurand-altered resonator 20, means 23 to measure its resonance frequency are then required. These typically involve a secondary excitation, either in open or closed loop, the actuator of which preferably does not involve magnetic fields. As described above, several methods can be used to this end; some of them are detailed hereafter.

Figure 4:
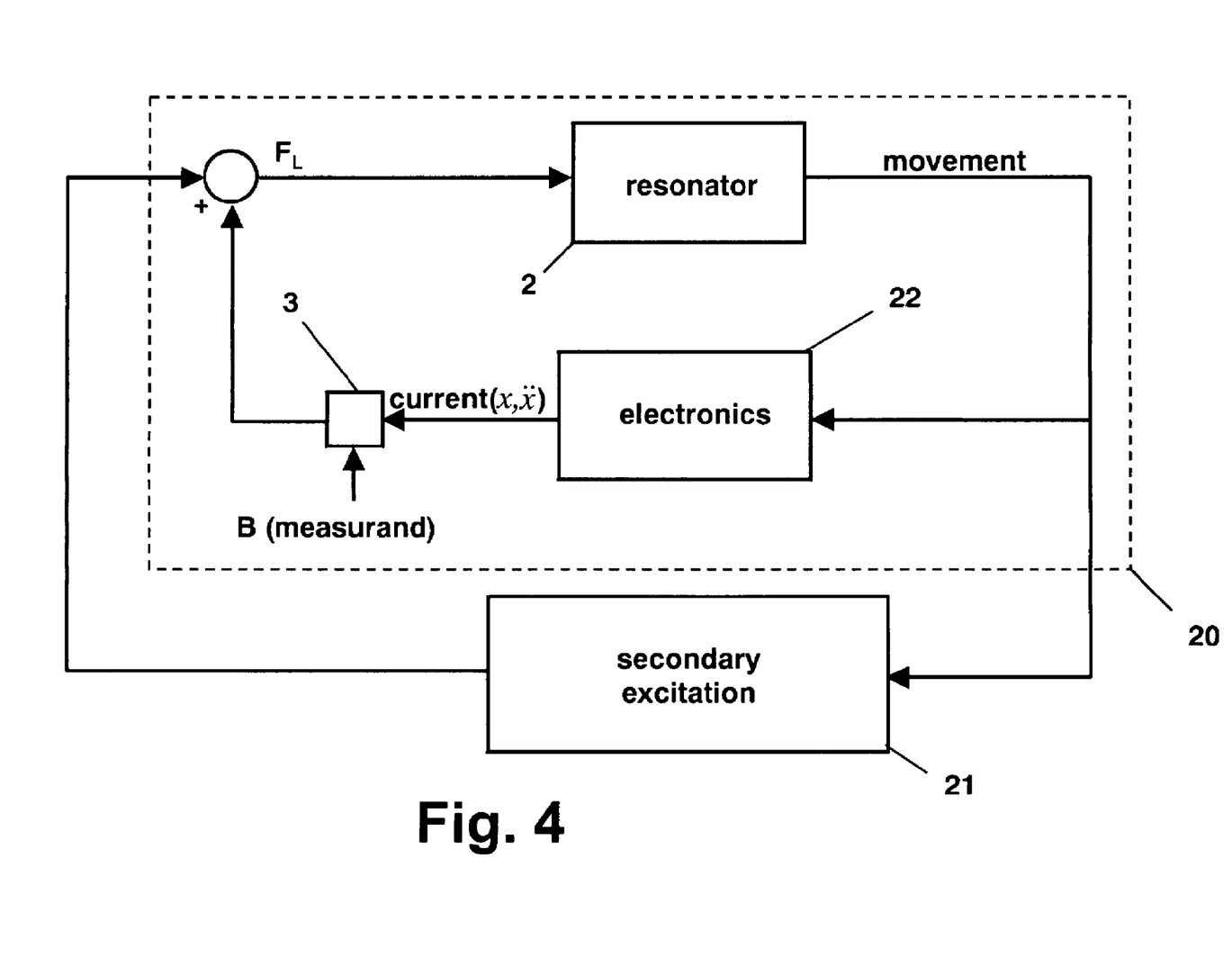
FIG. 4 shows a closed-loop architecture according to the present invention.

FIG. 4 shows the preferred embodiment architecture of this invention. In the present embodiment, the measurand-altered resonator 20 serves as frequency-determining element of an electrical oscillator, i.e. the whole structure of FIG. 4. This system 20 oscillates at its measurand-modulated resonance frequency. A secondary excitation 21 in a closed-loop architecture is used to generate and stabilize the oscillation of the measurand-altered resonator 20, the frequency of which is the sensor output.

The secondary excitation 21 can take different forms. Traditionally, a linear electronic circuit produces a force proportional to the resonator speed (i.e. in quadrature with its position) that compensates the resonator damping, also proportional to the speed, but with opposite sign. A non-linear element is added to stabilize the oscillation amplitude. The signal amplitude and phase are then fed back. Other solutions in which only the phase is in closed loop are possible; the phase-locked-loop (PLL) implementation shown in FIG. 7 belongs to this category. The preferred embodiment shown in FIG. 8 also has only the phase in closed-loop, but in contrast to the PLL version of FIG. 7, it does not require an additional oscillator.

Figure 5A:
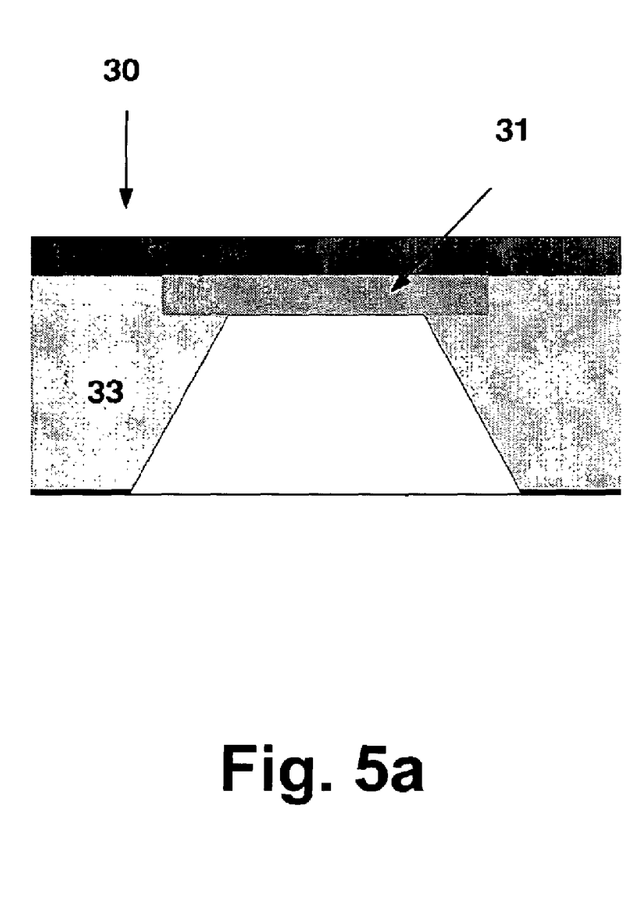
FIGS. 5a, 5b are two schematic cross-sections of the microsensor during post-processing.
Figure 5B:
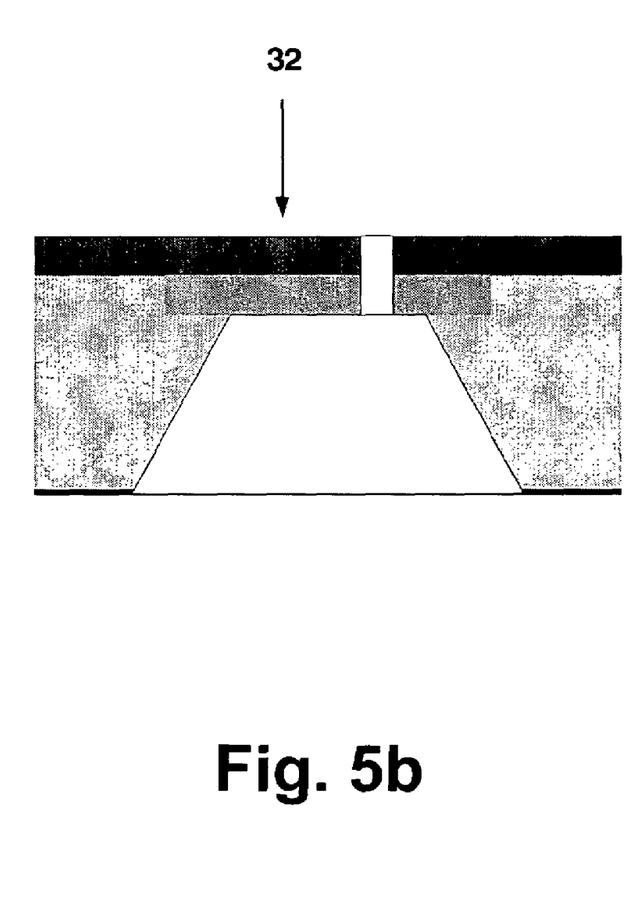

FIGS. 5a and 5b show schematic cross-sections of the microsensor according to the present invention during post-processing. In the preferred embodiment, the sensor has been fabricated using a few micromachining steps following a standard industrial CMOS (complementary metal oxide semiconductor) IC (integrated circuit) process realized on a silicon wafer 33.

FIG. 5a depicts the device after the anisotropic silicon etching from the wafer back, whereas FIG. 5b shows the same device after the resonator release from the wafer front. The resonator, a cantilever beam 32, then consists of the dielectric and metal layers 30, as well as the underlaying n-well 31 of the CMOS process.

This post-CMOS approach presents valuable advantages. For example, the conditioning circuitry can be placed on the same chip as the resonator, which usually improves the signal quality. Moreover, all or many transducing elements can be co-integrated with the circuitry during the CMOS process. Most of the overall device elements thus beneficiate of the well-established and very reliable industrial CMOS technologies, whereas the custom post fabrication is reduced to few simple and uncritical steps. Note that the resonating structure may be, but does not need to be integrated with the electronics. Multi-chip modules and discrete circuitry are also possible. Any skilled person would also know that many different MEMS fabrication technologies such as SOI, DRIE can be exploited to realize mechanical resonators. As mentioned earlier, many kinds of resonators and numerous oscillation modes are possible.

Figure 6:
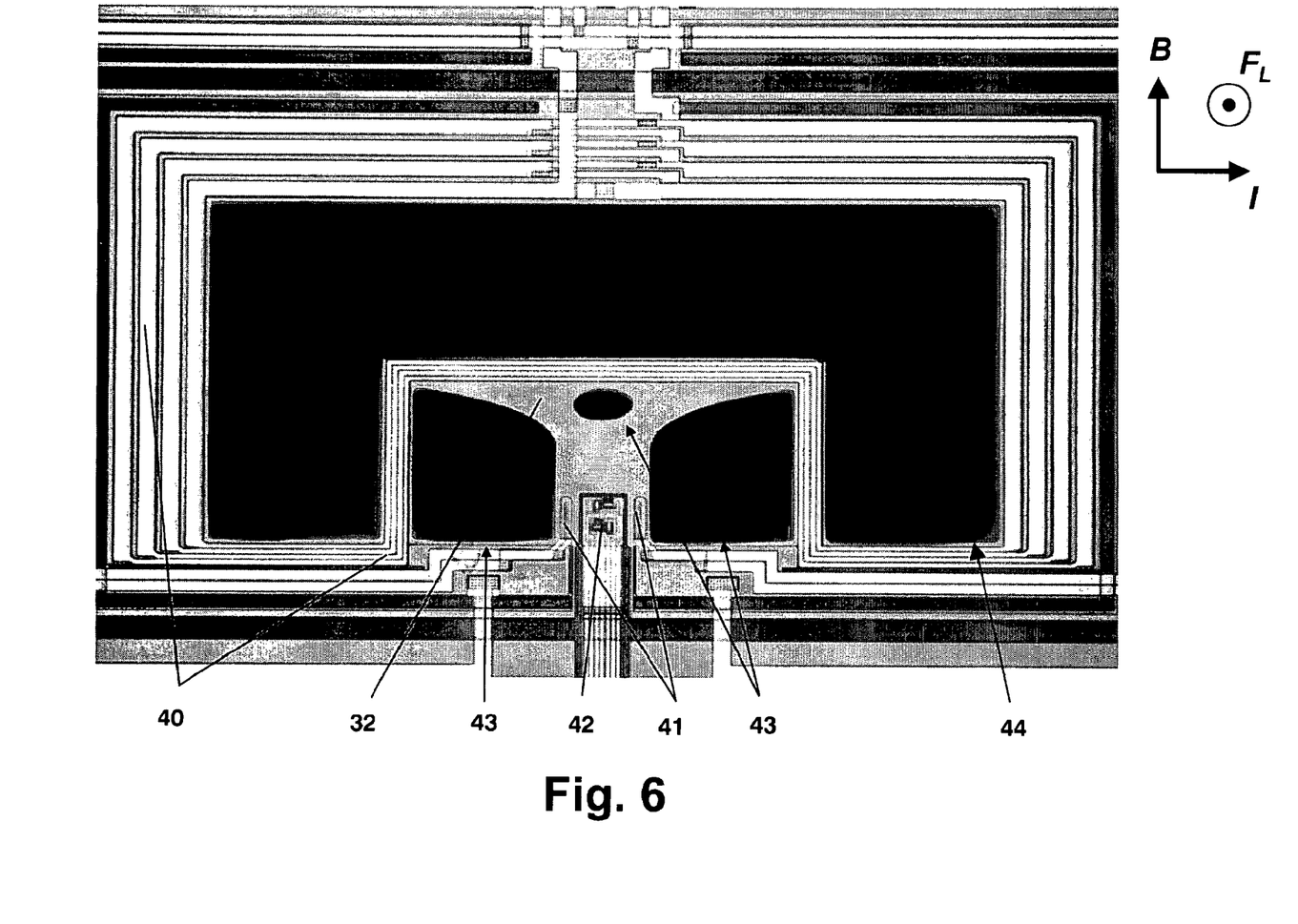
FIG. 6 is a micrograph of an implemented cantilever resonator.

FIG. 6 is a micrograph of the cantilever resonator 32 of FIG. 5b comprising a coil 40 to supply the AC excitation current, heating resistors 41 as actuator for the secondary excitation (21 in FIG. 4), and stress-sensitive transistors 42 as deflection (or position) detection means.

The planar coil 40 is created in the IC process and integrated on the resonator. A current in the windings of this coil generates the Lorentz force in conjunction with the measurand. The active part of the coil 40 is located at the tip edge of the cantilever 32, where the movement amplitude has its maximum. By this, maximal work ($F_L$×deflection) is periodically exchanged with the resonator, and maximal sensor sensitivity is achieved.

The sensitivity of the sensor can be further improved by decreasing the resonator equivalent mass and spring constant for the same effective coil length. This has been implemented by etching two to three holes 43 in the cantilever during the front-side release of the cantilever.

In the device of FIG. 6, an electrothermal effect is exploited for the secondary excitation. An actuation current is sent through resistors 41, which as a consequence of the Joule effect produces an elevation of temperature at their location. Because of the different expansion coefficients of the layers in the selected area, a bimorph effect is generated which deflects the cantilever. The heating resistors are advantageously placed near the anchored edge of the cantilever, so that the curvature they induce produces a maximal deflection of the cantilever. This actuation principle presents the advantage that all its element may be created during the standard IC process, and that it can be driven by the relative low on-chip electronics voltage. Other actuation means including electrostatic and piezoelectric actuators could be employed instead.

The four piezoresistive transistors 42 used to detect the resonator deflection are connected in a Wheatstone bridge, and placed closed to the anchoring end of the cantilever, where the stress reaches its maximum. This on-chip detection system does not necessitate additional material or additional processing.

As before, other transduction means, such as piezoelelectric, electrostatic, or laser beam deflection principles, could be used.

Figure 7:
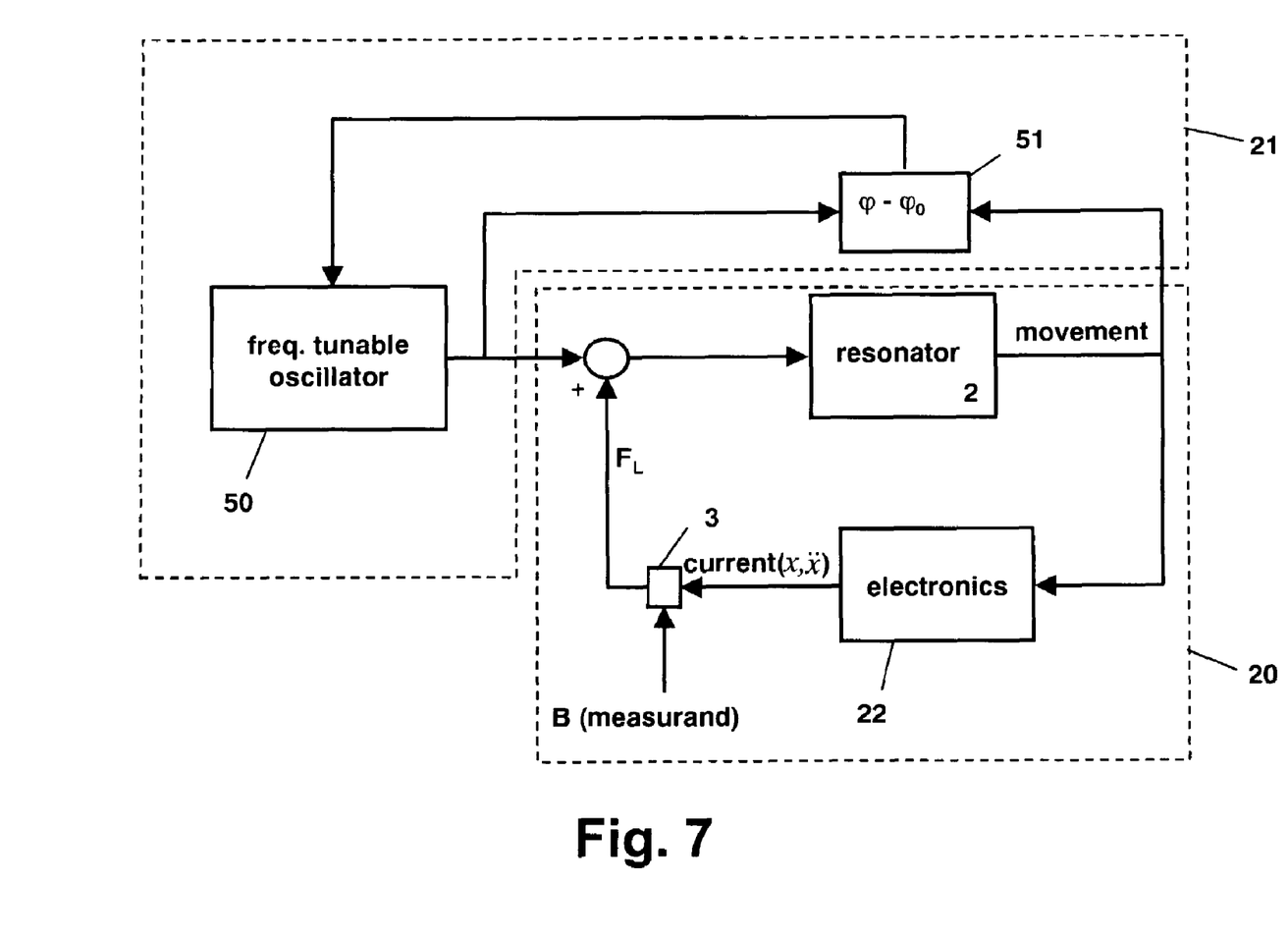
FIG. 7 illustrates a possible embodiment according to FIG. 4, involving a PLL architecture with a frequency-tunable oscillator.

FIG. 7 represent the PLL implementation mentioned above. In this approach, the frequency of a tunable oscillator 50 used to excite the resonator 2 is set by a controller 51, such that the signal phase drop on the measurand-altered resonator correspond to its resonance frequency.

Figure 8:
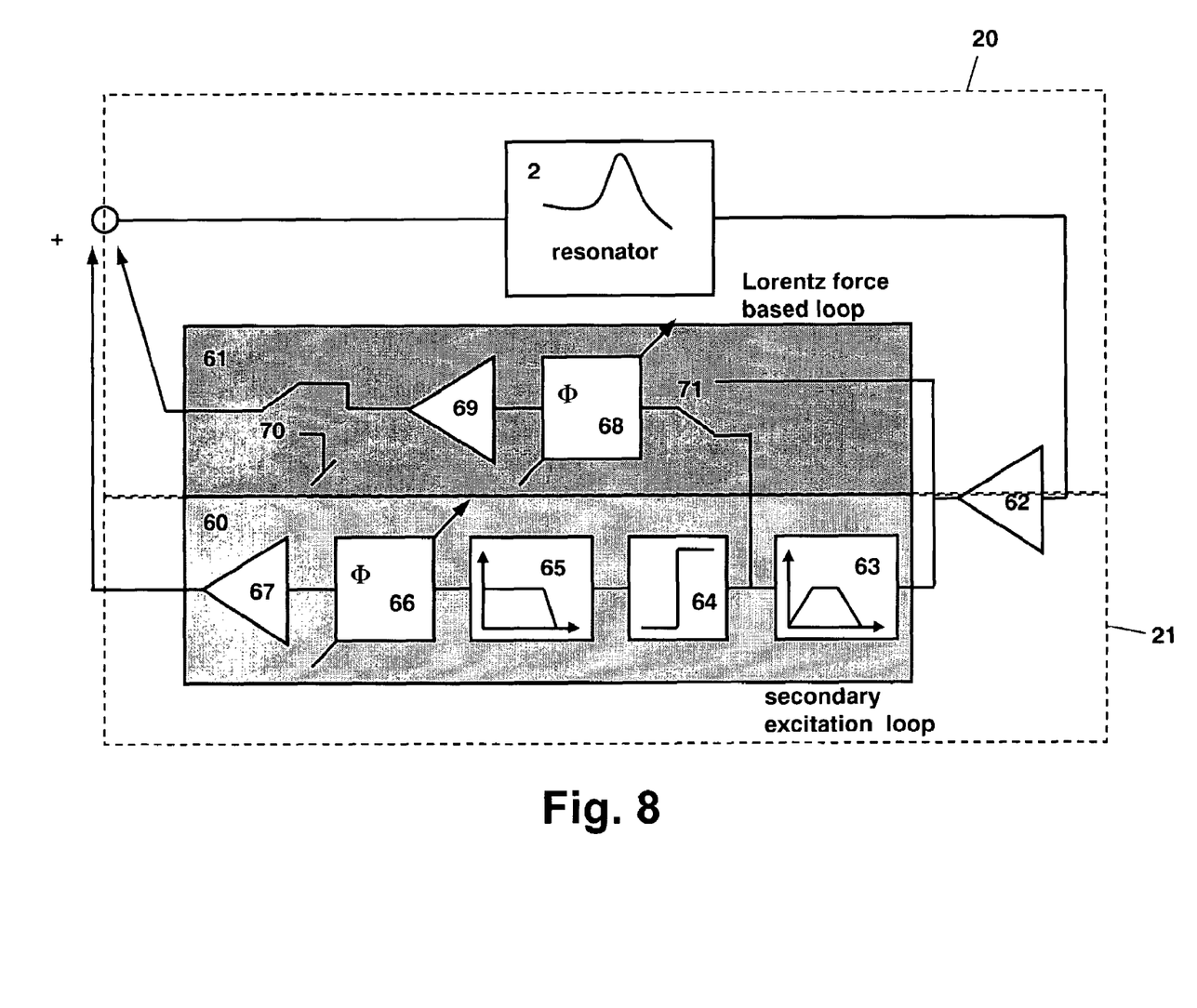
FIG. 8 is a detailed schematic of the preferred embodiment according to FIG. 4.

Referring to FIG. 8, a schematic for the preferred embodiment is shown. The bridge signal corresponding to the position or deflection of the resonator is first amplified in an amplifier 62, and then distributed between the secondary excitation feed-back 60 and the Lorentz force based feedback 61. In the Lorentz force based loop 60, the signal is first filtered by a band-pass filter 63. The amplitude information is then discarded using a comparator 64, which only keeps the phase information. A pseudo-sinusoidal wave form is then created by passing the square wave signal from the comparator 64 through a low-pass filter 65. Thereafter, the signal phase is set by an all-pass filter 66, such that the system oscillates at its resonance frequency. It is then fed back, at a constant amplitude defined by the gain of an amplifier 67, to the resonator 2. Thanks to the constant excitation amplitude provided by the secondary excitation 60, the phase tuning of the latter can easily be carried out by maximizing the resonator output amplitude. Note that a controller could be used to continuously perform this operation.

In order to create a current proportional to the position (deflection) of the resonator, the following loop 61 has been realized. A switch 71 is used to direct the amplified position signal either directly to an all pass filter 68, or if needed, previously through the band pass filter 63, to eliminate stray signals. The optionally filtered signal is then fed through an all pass filter 68, which allows to tune its phase, before the signal is amplified and applied as current to the coil of the resonator 2 by an amplifier 69. (It may be advantageous to have a coil with several windings on the resonator, as shown in FIG. 6.) The all pass filter 68 is generally useful to compensate possible phase shifts that could appear in some of the loop elements and that would degrade the synchronization between the Lorentz force and the position of the cantilever. As mentioned earlier, a similar design creating a Lorentz force proportional or at least in phase with the acceleration could also be used.

The excitation current supply can be stopped by grounding the corresponding line with a switch 70 to enable the calibration of the device. This can be done before or after each measurement, even at high sampling rates.

Such a device can be used as magnetometer, or to find the orientation of a magnetic field. The latter task can be performed by turning the device and looking for the output extrema.

Using two or more such devices, several components of the measurand can be evaluated. This way, a compass can be realized, that would not require the system to be moved, in contrast to the single device case mentioned in the preceding paragraph.

The invention claimed is:

1. A resonator-based magnetic field sensor system comprising:
   an oscillatory member as a resonator,
   a current driving means for driving an alternating electrical current through said resonator such that its resonance frequency is altered by an external magnetic field to be measured,
   means for detecting or measuring said resonance frequency when altered by said external magnetic field,
   wherein the current driving means generates said electrical current as a function of the movement of said resonator, said movement being the position, and/or speed, and/or acceleration of the resonator.

2. The sensor system according to claim 1, wherein
   the detection means includes means for generating a secondary excitation of the resonator, said secondary excitation being generated either in open or closed loop.

3. The sensor system according to claim 2, wherein the secondary excitation is independent of any magnetic-field-based actuators.

4. The sensor system according to claim 2, wherein
   the means for secondary excitation is part of a closed-loop structure, said closed-loop structure being able to sustain a self-oscillation and wherein the measurand-altered resonator is the frequency-determining element.

5. The sensor system according to claim 2, wherein
   the frequency of the secondary excitation is a function the movement of the resonator.

6. The sensor system according to claim 1, further comprising
   sensing means for converting the movement of the resonator into an electrical signal by providing an output which is a function of the movement of said resonator, said movement being the position, and/or speed, and/or acceleration of the resonator.

7. The sensor system according to claim 1, wherein
   the detection means includes means for determining the transfer function, and/or searching for the maximum amplitude, and/or the maximum phase drop of the measurand-altered resonator.

8. The sensor system according to claim 1, further including
   means for calibrating said sensor system by switching-off the electrical current through the resonator, said calibrating means being activatable once, periodically, or continuously.

9. An arrangement of a plurality of sensor systems according to claim 1, for detecting and/or measuring two or more components of a magnetic field.

10. A method comprising using a sensor system according to claim 1, for detecting and/or measuring the magnetic field of the earth.

11. A method of making a sensor system according to any claim 1, including using MEM technology and/or CMOS integration technology.

12. A resonator-based magnetic field sensor comprising:
    an resonator,
    electronic circuitry generating a first alternating current in said resonator at a resonance frequency of said resonator in phase with a position or acceleration of said resonator, and
    a resonance frequency reader measuring said resonance frequency.

13. A resonator-based magnetic field sensor comprising a first closed loop, wherein said first closed loop comprises:
    an resonator, and
    electronic circuitry generating a first alternating current in said resonator at a resonance frequency of said resonator in phase with a position or acceleration of said resonator, and
    wherein said sensor further comprises a resonance frequency reader measuring said resonance frequency.

14. The sensor of claim 13, further comprising a second closed loop generating and stabilizing an oscillation of said resonator.

15. The sensor of claim 14, further comprising an adder summing the current from said first closed loop and a current from said second closed loop and feeding a summed current through said resonator.

* * * * *